United States Patent
Yamaguchi et al.

(10) Patent No.: US 8,749,761 B2
(45) Date of Patent: Jun. 10, 2014

(54) DISPLACEMENT MEASUREMENT DEVICE, EXPOSURE APPARATUS, AND WORKING DEVICE

(75) Inventors: Wataru Yamaguchi, Utsunomiya (JP); Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 627 days.

(21) Appl. No.: 12/959,301

(22) Filed: Dec. 2, 2010

(65) Prior Publication Data
US 2011/0141451 A1    Jun. 16, 2011

(30) Foreign Application Priority Data
Dec. 10, 2009  (JP) .................................. 2009-280999

(51) Int. Cl.
G03B 27/72    (2006.01)
G03B 27/68    (2006.01)

(52) U.S. Cl.
USPC .............................................. 355/71; 355/52

(58) Field of Classification Search
USPC ............................ 355/77, 52, 71, 75; 356/494
See application file for complete search history.

(56) References Cited

U.S. PATENT DOCUMENTS

| | | | | |
|---|---|---|---|---|
| 5,104,225 A * | 4/1992 | Masreliez | ...................... | 356/494 |
| 5,146,085 A * | 9/1992 | Ishizuka et al. | .......... | 250/231.16 |
| 5,424,833 A * | 6/1995 | Huber et al. | ................... | 356/499 |
| 5,608,521 A * | 3/1997 | De Long | ........................ | 356/326 |
| 7,394,550 B2 * | 7/2008 | Takahashi et al. | ............. | 356/499 |
| 7,599,069 B2 * | 10/2009 | Toussaint et al. | .............. | 356/491 |
| 2003/0174344 A1 * | 9/2003 | Jones et al. | ..................... | 356/616 |
| 2004/0080755 A1 * | 4/2004 | Tamiya et al. | ................. | 356/499 |
| 2005/0007598 A1 * | 1/2005 | Ishizuka | ........................ | 356/499 |
| 2007/0223007 A1 | 9/2007 | Klaver | | |
| 2008/0215661 A1 | 9/2008 | Aono | | |
| 2011/0310396 A1 * | 12/2011 | Tamiya | ........................ | 356/498 |
| 2012/0050748 A1 * | 3/2012 | Kuroda | ........................ | 356/499 |

FOREIGN PATENT DOCUMENTS

| | | | |
|---|---|---|---|
| JP | 63-115012 | A | 5/1988 |
| JP | 04-270920 | A | 9/1992 |
| JP | 2002-116061 | A | 4/2002 |
| JP | 3435601 | B2 | 8/2003 |
| JP | 2007-292735 | A | 11/2007 |
| JP | 2008-185474 | A | 8/2008 |

* cited by examiner

Primary Examiner — Peter B Kim
Assistant Examiner — Deoram Persaud
(74) Attorney, Agent, or Firm — Canon USA, Inc. IP Division

(57) ABSTRACT

A device has a scale on which a grating pattern is formed, a light source to irradiate light on the scale, a wavelength plate to transform multiple diffracted lights from the light source into circular polarized light, respectively, an optical element to superposition and cause interference of the multiple diffracted lights, and a photodetector to receive the interfered light. Also, a generating unit to generate linearly polarized light by the light from the light source, so that the multiple diffracted lights input to the wavelength plate become linearly polarized light with a same mutual polarization direction.

17 Claims, 7 Drawing Sheets

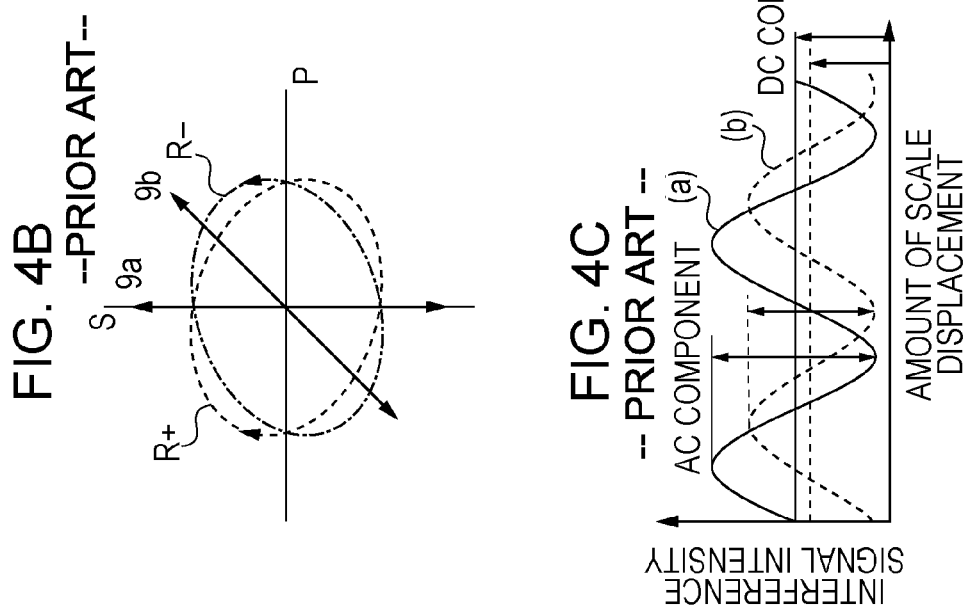
FIG. 4B -- PRIOR ART --
FIG. 4C -- PRIOR ART --
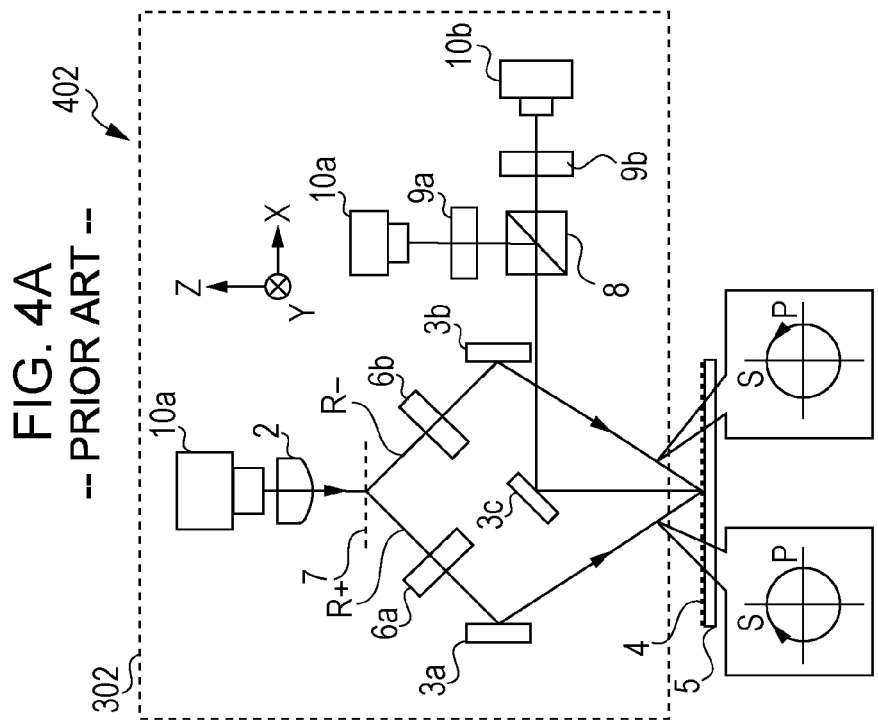
FIG. 4A -- PRIOR ART --

DISPLACEMENT MEASUREMENT DEVICE, EXPOSURE APPARATUS, AND WORKING DEVICE

BACKGROUND OF THE INVENTION

1. Field of the Invention

The present invention relates to a grating interferometry-type displacement measurement device.

2. Description of the Related Art

Heretofore, a displacement measurement device (encoder) such as a rotary encoder or linear encoder has been widely used to measure displacement amounts such as the position information, movement amount, rotation amount, and so forth of a physical object. A grating interferometry-type encoder is one of these serving as an encoder to measure displacement amount with a high degree of precision. A grating interferometry-type encoder is a device that inputs coherent light to a scale where is formed a grating pattern (i.e. diffraction grating), interference is caused with diffracted light which has been diffracted by a grating pattern, and displacement amount of the scale is obtained based on the phase changes of the obtained interfered light.

Japanese Patent Laid-Open No. 2007-292735 discloses a case of applying a grating interferometry-type displacement measurement device to an exposure apparatus that transfers a desired pattern onto a substrate. The displacement measurement device measures the displacement of a reference frame of a wafer stage supporting a substrate. Diffraction grating is applied to the reference frame, and displacement of the wafer stage as to the reference frame is measured by the encoder attached to the corresponding portion on the wafer stage. According to Japanese Patent Laid-Open No. 2007-292735, upon dividing a radiation beam into positive 1st-order diffracted light and negative 1st-order diffracted light, for example, using a first diffraction grating, the light is converted into linearly polarized light wherein the polarization directions are in mutually orthogonal directions, by a linear polarizer disposed in each light path. The positive and negative 1st-order diffracted light is input into a second diffraction grating, the diffracted light is superpositioned to cause interference, and the displacement of the second diffraction grating as to the first diffraction grating is measured from the change in phase difference of the positive 1st-order diffracted light and negative 1st-order diffracted light. According to Japanese Patent Laid-Open No. 2007-292735, a linear polarizer is disposed so that the polarization of the linear polarized light obtained via the linear polarizer so that the polarization directions of the linearly polarized light are mutually orthogonal, whereby positive 1st-order diffracted light and negative 1st-order diffracted light can be distinguished.

With a grating interferometry-type encoder, how finely the phase changes can be measured becomes important in high-precision measurements. In order to measure phase changes with high precision, using a minute scale with small grating pitches of the diffraction grating is important. As a manufacturing method of a minute scale, a laser drawing method to draw a grating pattern using a laser beam (Japanese Patent No. 3,435,601) and an etching method to selectively remove layers by etching and form an uneven stepped form are widely used.

However, in manufacturing a scale with a laser drawing method, beam diameters can change on the process face, resulting from output changes of a semiconductor laser or optical systems of a drawing device, so creating a grating pattern having even line widths and thicknesses can be difficult. Also, with an etching method, creating a grating pattern having even line widths and thicknesses can be difficult, due to the influence from etching scattering on the wall portion of the grating pattern side or the unevenness of the thickness of a metallic layer or the like. Accordingly, manufacturing error such as irregularities in the line width of the grating pattern, varying thicknesses, and so forth, occur.

Therefore, in the case that the line width and thickness of the grating pattern is not even, the phase difference amount at the time of scale diffraction changed according to the measurement position. Therefore, measurement error of varying magnitudes can occur depending on the measurement position on the scale, and accurately performing displacement measurement of an object becomes difficult. Also, measurement error can occur of changes according to measurement position on the scale, not only from changes to the alternating-current components and changes to the direct-current components of the reference signal waveforms, but also from changes to phase difference of superpositioned diffracted light. Also, with a method in which obtained interference signals are corrected as with Japanese Patent Laid-Open No. 2008-185474, measurement error due to manufacturing error in the scale cannot be sufficiently corrected, so highly precise measurement is difficult.

SUMMARY OF THE INVENTION

The device according to the present invention includes a scale on which a grating pattern is formed; a light source configured to irradiate light on the scale; a wavelength plate to transform a plurality of diffracted lights from the scale into circular polarized light, respectively; an optical element configured to superposition and cause interference of the plurality of diffracted lights; a photodetector configured to receive the interfered light; and a generating unit to transform light from the light source into linearly polarized light, so that the plurality of diffracted light input to the wavelength plate becomes linearly polarized light with a same mutual polarization direction.

Further features of the present invention will become apparent from the following description of exemplary embodiments with reference to the attached drawings.

BRIEF DESCRIPTION OF THE DRAWINGS

FIGS. 4A through 4C are diagrams to describe a conventionally-used displacement measurement device.

DESCRIPTION OF THE EMBODIMENTS

Figure 1A:
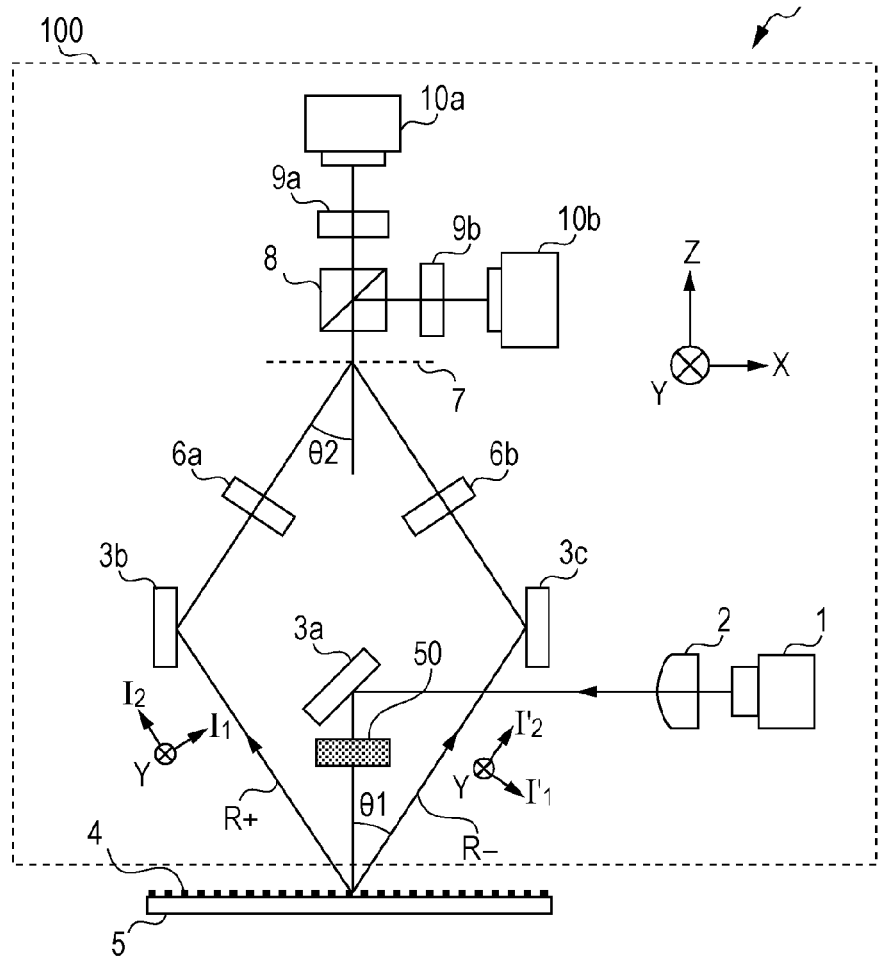
FIGS. 1A and 1B are configuration diagrams of a displacement measurement device according to a first embodiment.

Preferred embodiments of the present invention will be described in detail with reference to the appended diagrams. Note that the same reference numerals are appended to the same members in the various diagrams, and repetitive description will be omitted.

First Embodiment

FIG. 1A is a schematic diagram showing a configuration of a displacement measurement device 200 serving as one aspect of the present invention. In FIG. 1A, the direction that is orthogonal as to the paper face will be the Y-direction, the direction that is orthogonal to the Y-direction and that is in a horizontal direction to the paper face will be the X-direction, and the direction that is orthogonal to the X-direction and Y-direction and that is vertical on the paper face will be the Z-direction. The displacement measurement device 200 is a device made up of a detecting head 100 and scale 5, and measures relative displacement amount in the X-direction of the detecting head 100 and scale 5. The detecting head 100 is made up of a laser light source 1, collimator lens 2, mirror 3, polarizer 50, λ/4 plate 6, reference diffraction grating 7 (optical element), beam splitter (BS) 8, polarizer 9, and photodetector 10. Note that the mirror 3, λ/4 plate 6, polarizer 9, and photodetector 10 each include 3a through 3c, 6a and 6b, 9a and 9b, and 10a and 10b. Also, with the present embodiment, description is given in the case of using the polarizer 50 as a linear polarization generating unit, and using the λ/4 plate 6 as a wave plate.

In FIG. 1A, coherent light that has been emitted by the laser light source 1 is reflected by the mirror 3a as a parallel light flux via the collimator lens 2. Subsequently, upon this light having been linearly polarized via the polarizer 50, light that has transmitted the polarizer 50 is input orthogonally into the scale 5. The light input into the scale 5 is diffracted by the grating pattern 4, and divided into multiple diffracted lights of positive 1st-order diffracted light R+ and negative 1st-order diffracted light R−. A one-dimensional grating pattern 4 is formed on the scale 5, wherein the X-direction is the cyclic direction and the Y-direction is the grating direction (grid direction). The grating pattern 4 is formed with a large number of grooves in the grating pattern 4 in the Y-direction. Therefore, with the displacement measurement device 200 in FIG. 1A, the X-direction becomes the measurement direction, and the Y-direction becomes the non-measurement direction.

Now, if we say the displacement amount of the scale is ΔX, and the grating pitch of the scale is P, the phase change amount Δφ in one reflection of an m-order diffraction is expressed as $$\Delta\phi = 2\pi m \Delta X / P \quad \text{(Expression 1)}$$

Accordingly, in the case of 1st-order diffracted light (m=1), when the grating is moved one pitch, the phase is changed by 2π. Therefore, in the case of superpositioning positive 1st-order diffracted light and negative 1st-order diffracted light, a phase change of 4π occurs relative to the movement of one pitch of grating. Consequently, a two-cycle phase change occurs as to the movement of one pitch of grating. As mentioned above, according to displacement measurement by a grating interferometer-type encoder, the scale is moved in the cycle direction of the grating pattern, and the phase change amount is measured, whereby the change amount is obtained. Therefore the phase change amount Δφ is expressed as in Expression 1, whereby, as the grating pitch becomes smaller, the phase change amount Δφ accompanying the scale movement of one pitch of grating becomes larger. By reducing the pitch, the phase change can be finely measured, enabling high-precision displacement measurement to be realized. Accordingly, in order to perform measurement with high precision, how fine the grating pitch is of the minute scale used becomes an important point.

Now, if we say that a diffraction angle θ1 of the diffracted light which has been divided into two by the grating pattern 4, the order of diffraction is m, the wavelength of the laser light source 1 is λ, and the grating pitch of the grating pattern 4 is P, this is expressed as $$P \cdot \sin\theta_1 = m\lambda \quad \text{(Expression 2)}$$

Note that the direction that the light flux of the positive 1st-order diffracted light R+ travels is defined as $I_2$, and the direction that the light flux of the negative 1st-order diffracted light R− travels is defined as $I_2'$. Also, the direction orthogonal to the Y-direction and $I_2$ is defined as $I_1$, and the direction orthogonal to the Y-direction and $I_2'$ is defined as $I_1'$.

Next, upon the positive 1st-order diffracted light R+ and negative 1st-order diffracted light R− each having been reflected by the mirrors 3b and 3c, this light is input into the reference diffraction grating 7 with an incident angle θ2 via the λ/4 plates 6a and 6b.

Now, the optical axis of the λ/4 plates 6a and 6b is disposed so as to have a +45 degree and −45 degree angles in the polarization direction of the positive 1st-order diffracted light R+ and negative 1st-order diffracted light R−, respectively. That is to say, the λ/4 plates 6a and 6b are disposed such that, after passing through the λ/4 plates 6a and 6b, the positive 1st-order diffracted light R+ and negative 1st-order diffracted light R− becomes clockwise circular polarized light and counter-clockwise circular polarized light, respectively. Note that the polarization state of circular polarized light should be polarized light in the mutually opposite direction, and is not limited to the case described above. Also, in order to diffract the positive 1st-order diffracted light R+ and negative 1st-order diffracted light R− in the orthogonal direction to the face of the reference diffraction grating 7, if we say that the grating pitch of the reference diffraction grating 7 is d, the incident angle θ2 to the reference diffraction grating 7 is expressed in the Expression below.

$$d \cdot \sin\theta_2 = m\lambda \quad \text{(Expression 3)}$$

That is to say, the positive 1st-order diffracted light R+ and negative 1st-order diffracted light R− is input into the reference diffraction grating 7 with the incident angle θ2 which satisfies Expression 3, thereby diffracting in the direction orthogonal to the face of the reference diffraction grating 7, and these are superpositioned and subjected to interference.

Subsequently, the superpositioned interfered light is split into two light fluxes with a beam splitter 8. The split two light fluxes are received by photodetectors 10a and 10b, via polarizers 9a and 9b, respectively. For example, a photoelectric converter such as a photodiode or CCD can be used for the photodetectors 10a and 10b. The photodetectors obtain information relating to signal intensity from the interference signal subjected to photoelectric conversion.

Now, the polarizers 9a and 9b are disposed so as to remove the polarization components that are mutually shifted 45 degrees. Thus, with the photodetectors 10a and 10b, a two-phase sine-wave signal having a phase difference of 90 degrees mutually is detected, and information relating to the signal intensity is obtained. Based on the signal intensity, the change amount of the scale 5 can be identified including direction. If we say that the initial phase is φ0, and the relative change difference of the scale 5 and detecting head 100 is ΔX, the two-phase sine-wave signal can be expressed in the following Expressions.

$$I1 = A \cdot \cos(4\pi \cdot \Delta X / P + \phi 0) \quad \text{(Expression 4-1)}$$

$$I2 = A \cdot \cos(4\pi \cdot \Delta X / P + \phi 0 + \pi/2) = -A \cdot \sin(4\pi \cdot \Delta X / P + \phi 0) \quad \text{(Expression 4-2)}$$

Thus, by I1/I2, $$I1/I2 = -\tan(4\pi \cdot \Delta X / P + \phi 0) \quad \text{(Expression 4-3)}$$

whereby $$\Delta X = \{\arctan(-I1/I2) - \phi 0\} \cdot P / 4\pi \quad \text{(Expression 4-4)}$$

Note that in Expressions 4-1 and 4-2, the amplitude of the two-phase sine-wave signals are denoted as A, and are equal, but in the case that the intensity differs, these need to be multiplied beforehand so as to have similar amplitude.

According to the displacement measurement device 200 in FIG. 1A, in the case of using positive/negative 1st-order diffracted light, the light and dark cycles of interference in the photodetector 10a or 10b is similar to two cycles of the sign-wave signal having one pitch worth of displacement of the grating pattern 4 formed on the scale 5. Accordingly, the displacement amount of the scale 5 can be obtained based on the amount of light and dark of the interfered light received by the photodetector 10a or 10b.

Figure 2B:
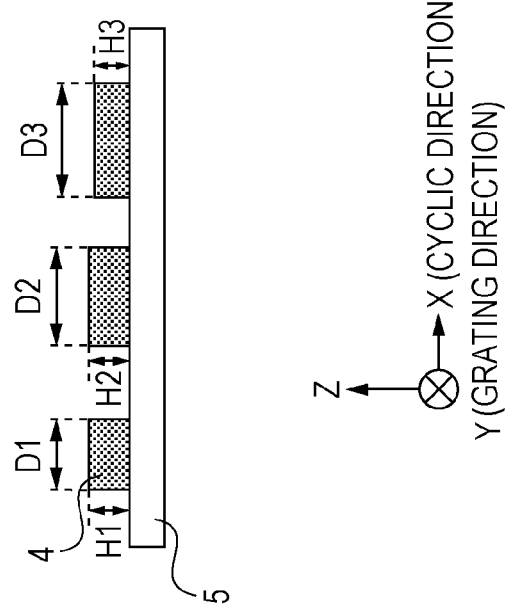
FIGS. 2A and 2B are diagrams to describe manufacturing error.
Figure 2A:
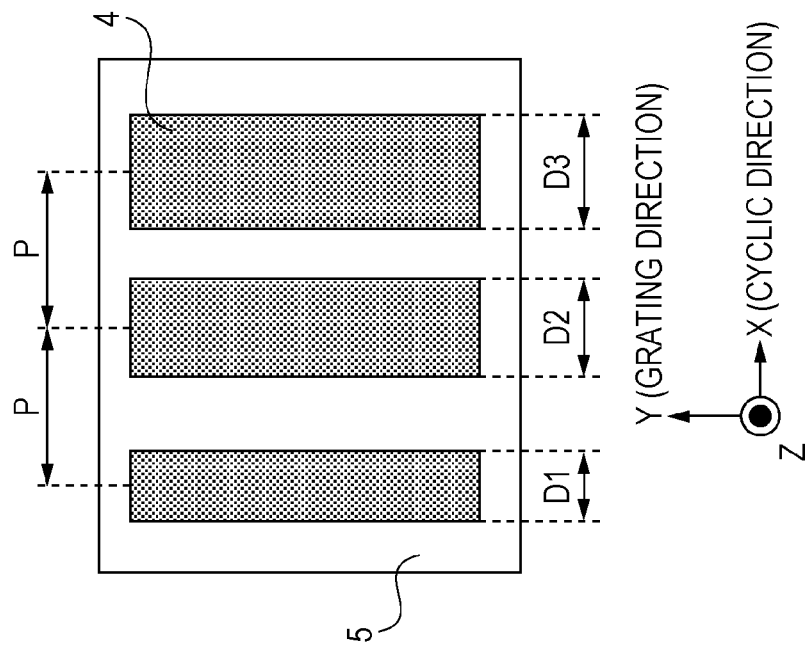

As a result of dedicated review by the present inventor, it was learned that measurement error occurs due to manufacturing error in the grating pattern in the case of using conventional techniques. An occurrence mechanism will be described using FIGS. 2A through 4C. FIGS. 2A and 2B are diagrams showing a scale 5 having a grating pattern 4 formed. FIG. 2A is a diagram viewing the scale 5 from the Z-direction, and FIG. 2B is a diagram viewing the scale 5 from the Y-direction. In order to simplify description, three patterns are formed on the scale 5 at a grating pitch P of a fixed length. As described above, with laser drawing and etching, manufacturing error can occur in the line widths and thicknesses at the time of creating the grating pattern. Therefore, as shown in FIGS. 2A and 2B, unevenness occurs in the line width (D1 through D3) and thickness (H1 through H3) of the grating pattern 4. With the influence of structural birefringence accompanying the manufacturing error in the grating pattern 4, measurement error occurs from two causes described below.

Figure 3B:
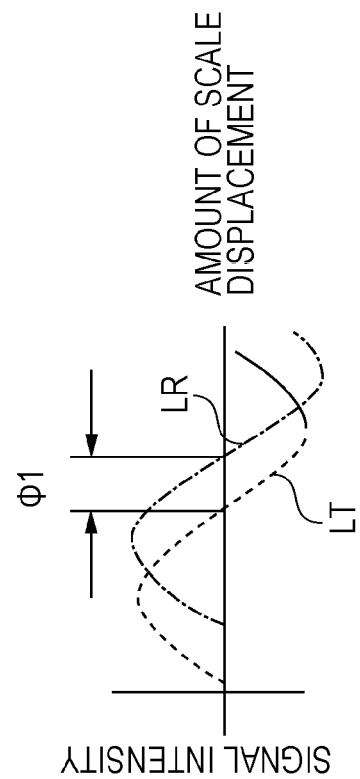
FIGS. 3A and 3B are diagrams to describe a conventionally used displacement measurement device.
Figure 3A:
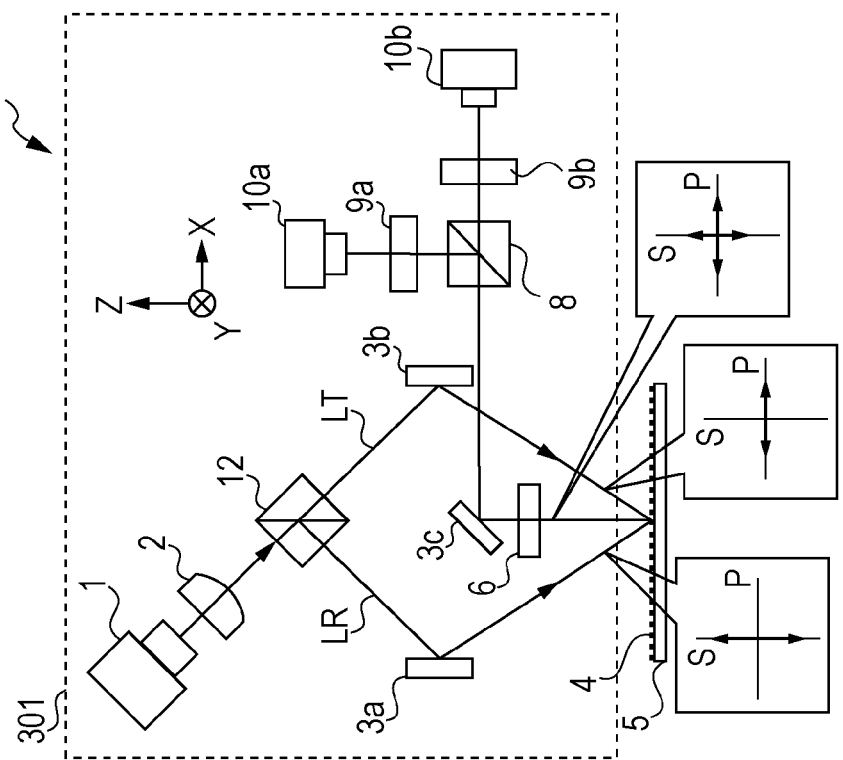

A first cause is a shift in phase difference at the time of scale diffraction. Now, the shift in phase difference will be described using an example of a general displacement measurement device 401 in FIG. 3A as a conventional technique. With the displacement measurement device 401, light fluxes LT and LR in different polarizing directions that have been separated using a polarizing beam splitter 12 are diagonally input into the scale 5, and interference of the diffracted light is caused. Thus, relative displacement amount in the X-direction of the detecting head 301 and scale 5 is measured. With the detecting head 301, the light flux LT that transmits the polarizing beam splitter becomes P-polarized light, and the reflected light flux LR becomes S-polarized light. Now, when the grating pattern 4 of the scale 5 has manufacturing error as in FIGS. 2A and 2B, differences occurs between the S-polarization components and P-polarization components in the phase change amount at the time of scale diffraction from the influence of structural birefringence. With the displacement measurement device 401, the S-polarized light and P-polarized light is input into the scale 5, whereby the polarization components of the light fluxes LT and LR diffracted with the scale 5 become P-polarized light and S-polarized light, respectively. FIG. 3B shows the signal intensity change in the light fluxes LT and LR detected in the case of relative displacement of the detecting head 301 and scale 5. As in FIG. 3B, differences in phase change amounts occur at the time of scale diffraction by the influence of structural birefringence, so a phase difference shift of ϕ1 occurs in the detected light fluxes LT and LR. As described above, with a grating interferometer-type encoder, displacement amount is measured based on the phase change of two lights to be interfered, and measurement error occurs according to the phase difference shift ϕ1. Accordingly, in the case that line width unevenness and thickness variation occurs in the grating pattern 4 on the scale 5, measurement linearity decreases. Note that not only the configuration in FIG. 3A, but in configurations wherein two diffracted lights having difference polarization components are interfered, a shift occurs in the phase difference in accordance with structural birefringence. Therefore, when line width unevenness and thickness variation occurs in the grating pattern 4 of the scale 5, measurement error that changes depending on the measurement position occurs.

Next, a second cause is the change in polarization components at time of scale diffraction. Now, the changes in polarization components will be described, using a general displacement measurement device 402 in FIG. 4A as an example of a conventional technique. The displacement measurement device 402 is a device that diagonally inputs clockwise polarized light and counter-clockwise polarized light into the scale 5 and the diffracted light is interfered, thereby measuring displacement amounts relative to the X-direction of the detecting head 302 and scale 5. That is to say, the light emitting the laser light source 1 is diffracted by the reference diffraction grating 7, and the positive/negative 1st order diffraction light R+ and R− are input into the scale 5 via the λ/4 plate 6, upon which the interfered light that has been diffracted and superpositioned with the scale 5 is received by photodetectors 10a and 10b via polarizers 9a and 9b. Now, because of influence from structural birefringence, differences in diffraction rate and phase change amounts at the time of scale diffraction differs between the S-polarization component and S-polarization component, so the polarization components become elliptic polarization with the scale 5. With the displacement measurement device 402, the relation between the polarization components removed by the polarizers 9a and 9b and the positive/negative 1st-order diffracted light R+ and R− are shown in FIG. 4B. In FIG. 4B, the polarization components of the positive/negative 1st-order diffracted light R+ and R− become elliptical polarization with the scale 5, and unevenness occurs in the intensity change of the interference signals of light received by the photodetectors 10a and 10b. Now, in order to describe in detail about the unevenness of the interference signal intensity change accompanying the change in polarization components at time of scale diffraction, the interference signal waveform detected by two phases by the displacement measurement device 402 is shown in FIG. 4C. The two interference signal waveforms (a) and (b) shown in FIG. 4C indicates interference signal intensity of the light received by the photodetectors 10a and 10b in the case of relative displacement of the detecting head 302 and scale 5. From FIG. 4C, in accordance with the elliptical polarization of the positive/negative 1st-order diffracted light R+ and R− diffracted with the scale 5, differences in direct current components (DC COMPONENT) and differences in alternating current components (AC COMPONENT) occur between the two-phase detected interference signal waveforms (a) and (b). Thus, intensity change in the interference signals become uneven, and measurement error occur. The measurement error herein is an error that occurs cyclically, resulting from the grating pitch of the grating pattern 4 and is called a cyclic error. In the case there is line width unevenness or thickness variation in the grating pattern 4 of the scale 5, the cyclic error changes. Therefore, different sizes of measurement error occur depending on the measurement position on the scale 5. Note that not only the configuration in FIG. 4A, but in configurations wherein the polarization components of superpositioned diffracted light become elliptical polarization, measurement differences occur from the change in polarization components. Therefore, if there is manufacturing error in the grating pattern, measurement error changes depending on the measurement position.

As described above, it has been learned that, in the case a conventional displacement measurement device has manufacturing error in the grating pattern on the scale, (1) the shift in phase difference and (2) change in polarization components, of the scale diffraction change according to measurement position, and measurement error occurs.

Figure 1B:
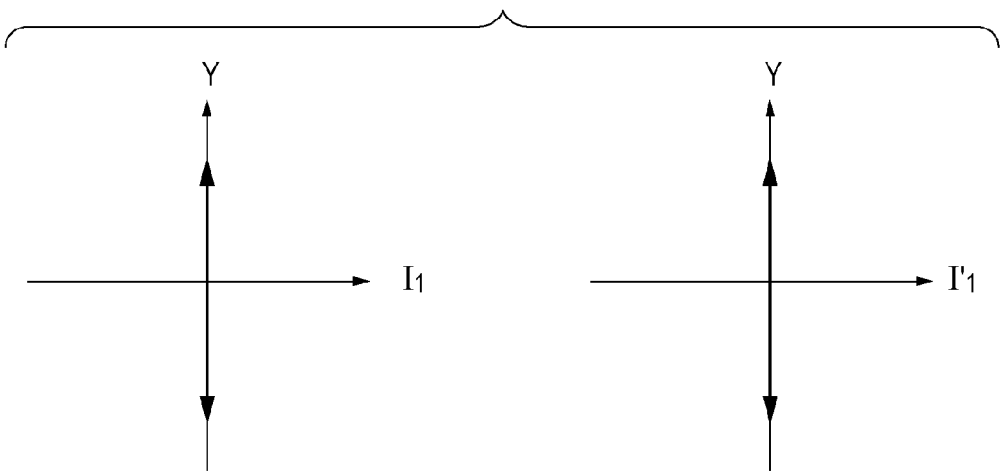

Next, a configuration of the present invention wherein measurement difference that changes according to measurement position, resulting from line width unevenness and thickness variation due to manufacturing error in the grating pattern 4 on the scale 5 is reduced, will be described. In order to avoid influence of (1) phase difference shifting at the time of scale diffraction, the configuration must be such that the polarization components of the two light fluxes superpositioned to cause to interference much be equal. Also, in order to suppress influence from (2) change in polarization components at time of scale diffraction, elliptical diffraction should be avoided, and in order to do so, the polarization component of the light input into the wave board (λ/4 plate) to convert to circular polarization has to be linear polarization. That is to say, in order to avoid influence of (1) and (2), and reduce the measurement error accompanying the manufacturing error, the light that is input into the (λ/4 plate) disposed in the light path of the two diffracted lights should simultaneously satisfy (I) that both have equal polarization components, and (II) that linear polarization is used. Note that an (I) equal polarization components unit that with the polarization components of the positive/negative 1st-order diffracted light R+ and R− diffracted by the scale 5 as shown in FIG. 1B, the polarization direction of linear polarization on a $I_1Y$ plane and $I_1'Y$ plane are in an angle equal as to the Y-axis.

According to the present embodiment, the light of linear polarization wherein the polarization direction matches one of the grating directions of the grating pattern 4 and the cycle direction is input into the scale 5 using the polarizer 50. Thus, measurement differences due to manufacturing error can be reduced. According to the present embodiment shown in FIG. 1A, the polarizer 50 is used to transform the polarization components of the light input to the scale 5 into either S-polarization or P-polarization. Note that in FIG. 1A, the polarization direction of linear polarization matching the grating direction (Y-direction) of the grating pattern will be called S-polarization, and linear polarization orthogonal to the linear direction of the light and the S-polarization is called P-polarization. In the case of FIG. 1A, the light input to the scale 5 by the polarizer 50 becomes either S-polarization components or P-polarization components, so the positive/negative 1st order diffraction light R+, R− diffracted by the scale 5 will be linear polarization of either S-polarization or P-polarization. That is to say, in the case that the polarization component of the light input to the scale 5 is S-polarization, the positive/negative 1st order diffraction light R+, R− becomes S-polarization, and in the case that the polarization component of the light input to the scale 5 is P-polarization, the positive/negative 1st order diffraction light R+, R− becomes P-polarization. Accordingly, the present embodiment has a configuration that satisfies that the light that is input into the λ/4 plates 6a and 6b disposed in the light path of the two diffracted lights satisfies (I) that both have equal polarization components, and (II) that linear polarization is used. Accordingly, with the present invention wherein either S-polarization or P-polarization light is input, (2) change in polarization components at the time of scale diffraction by the structural birefringence does not occur. Also, since the positive/negative 1st order diffraction light R+, R− has linear polarization of either S-polarization or P-polarization, displacement change amount at the time of scale diffraction is equal, and (1) shift in phase difference does not occur. Thus, using the polarizer 50, light with linear polarization having a polarization direction that matches either the grating direction of the grating pattern 4 or the cycle direction is input into the scale 5, whereby measurement error due to manufacturing error can be reduced. According to the present embodiment, in the case that the polarization direction of linear polarization via the polarizer 50 does not match either the grating direction of the grating pattern 4 or the cycle direction, measurement error occurs from the (2) change in polarization components at the time of scale diffraction. Therefore, with the displacement measurement device 200 according to the present embodiment, how well the polarization direction of linear polarization via the polarizer 50 matches the grating direction of the grating pattern 4 or the cycle direction becomes an important point.

As described above, according to the present embodiment, in the case that a rotation shift occurs in the polarizer 50 as to the Z-axis, and the polarization direction of linear polarization via the polarizer 50 does not match either the grating direction of the grating pattern 4 or the cycle direction, the polarization component at the time of scale diffraction changes. The polarization component at the time of scale diffraction changes according to manufacturing error in the grating pattern 4. Therefore, differences in direct current components and differences in alternating current components each occur between the two phases of interference signal waveforms detected, according to the measurement position on the scale 5. Accordingly, whether or not there is rotation shift in the polarizer 50 as to the Z-axis can be determined by the amount of unevenness of intensity change to the two phases of interference signals detected at the time that the detecting head 100 and scale 5 are relatively displaced in the cycle direction of the grating pattern 4 (X-direction). Thus, in the event that the detecting head 100 and scale 5 are relatively displaced in the X-direction, position adjustments are performed in the rotation direction as to the Z-axis of the polarizer 50 so that unevenness of intensity change to the two phases of interference signals detected is minimized. Thus, the positions of the polarization direction of linear polarization obtained via the polarizer 50 and the rotation direction as to the Z-axis of the grating pattern 4 can be adjusted accurately. Also, in the event of position adjustment of the polarizer 50, a driving unit such as a piezo device or motor, unshown, may be provided to perform position adjustment in the rotation direction as to the Z-axis. Note that for position adjustment in the rotation shift as to the Z-axis of the polarizer 50, position adjustment should be performed so as to suppress measurement error that occurs from rotational shift so as to be within a range of acceptable values. According to the present embodiment, in the case that the polarization direction of the linear polarization obtained via the polarizer 50 and the grating direction of the grating pattern 4 is shifted 45 degrees on an X-Y plane, the measurement error from influence of elliptical polarization is maximal.

Now, if the measurement error resulting from the (2) change in polarization components is ΔX1, and the angle shift between the polarization direction of the linear polarization obtained via the polarizer 50 and the grating direction of the grating pattern 4 is Δθ, then ΔX1 changes depending on sin Δθ. That is to say, for example, by adjusting Δθ to 15 degrees or less, ΔX1 can be reduced to 1/5 or less, compared to the case where Δθ is 45 degrees. Also, for example, by adjusting Δθ to 10 degrees or less, ΔX1 can be reduced to 1/10 or less, compared to the case where Δθ is 45 degrees, and this is effective for a displacement measurement device having a more high-accuracy measurement accuracy. Further, for example, by adjusting Δθ to 4 degrees or less, ΔX1 can be reduced to 1/100 or less, compared to the case where Δθ is 45 degrees, and this is effective for a displacement measurement device having a more ultra-high-accuracy measurement accuracy. Thus, by adjusting so that the angle shift Δθ between the polarization direction of the linear polarization obtained via the polarizer 50 and the grating direction of the grating pattern 4 is smaller, the measurement error ΔX1 can be reduced. Also, in the case of diffracting linear polarization of P-polarization as to the scale 5, the angle shift between the polarization direction of the linear polarization and the cycle direction of the grating pattern 4 is adjusted as Δθ.

Next, the reference diffraction grating 7 of the detecting head 100 will be described. Manufacturing error occurs in the reference diffraction grating 7 of the detecting head 100 shown in FIG. 1A also, similar to the grating pattern 4 of the scale 5. In the case that the line width and thickness of the grating pattern of the reference diffraction grating 7 differs from the set values, (1) shift of phase difference occurs at time of diffraction. Also, there is concern that elliptical polarization can occur from the influence of (2) change in polarization components.

Two methods to reduce influence from manufacturing error in the reference diffraction grating 7 will be described below. A first method is correction processing of the interference signal. With this method, similar to a correction processing method that is a conventional technique, differences of alternating current components and differences of direct current components between the detected two phase interference signal waveforms are each obtained, and signal processing is performed to correct the differences between the interference signal waveforms. Thus, influence from (2) change in polarization components accompanying the manufacturing error in the reference diffraction grating 7 can be reduced.

A second method to reduce influence from manufacturing error in the reference diffraction grating 7 is correction by position adjustment to the λ/4 plate 6. With this method, the slope of the λ/4 plate 6 as to the light beam and the direction of the light axis of the λ/4 plate 6 are adjusted, whereby corrections are made so that the differences of alternating current components and differences of direct current components between detected two phase interference signal waveforms are reduced. Thus, influence by (2) change in polarization components accompanying the manufacturing error in the reference diffraction grating 7 can be reduced. Note that regarding a (1) shift in phase difference, in a displacement measurement device according to the present embodiment, the reference diffraction grating 7 is fixed to the detecting head 100, and thereby can be handled as an offset value (fixed value). Therefore, with the displacement measurement device to obtain relative displacement of the detecting head 100 and scale 5, influence from a phase difference shift can be ignored. Conversely, with a displacement measurement device used conventionally, (1) shift of the phase difference changes according to the measurement position on the scale, and measurement error depending on the measurement position on the scale can occur, so measuring with high precision is difficult.

According to the present embodiment, a polarizer 50 is disposed between the mirror 3a and scale 5, and linearly polarized light wherein the polarization direction matches either the grating direction or cycle direction of the grating pattern 4 is input into the scale 5. Thus, regarding the measurement error accompanying the manufacturing error in the grating pattern 4, influence from (1) shift of the phase difference during scale diffraction and (2) change in polarization components can be reduced to reduce the measurement error due to manufacturing error. Thus, a displacement measurement device that can measure relative displacement amounts of the detecting head 100 and scale 5 with high precision can be provided.

Also, according to the present embodiment, a linear polarization laser that emits linearly polarized light may be used as a light source, without the linear polarization generating unit. In this case, the polarization direction of the linear polarization emitted from the laser light source 1 to the scale 5 is matched to the grating direction or cycle direction of the grating pattern 4, whereby measurement error due to manufacturing error can be reduced, similar to the case of using the polarizer 50.

Second Embodiment

Next, a displacement measurement device having a configuration different from the first embodiment will be described as a second embodiment of the present invention.

Figure 5A:
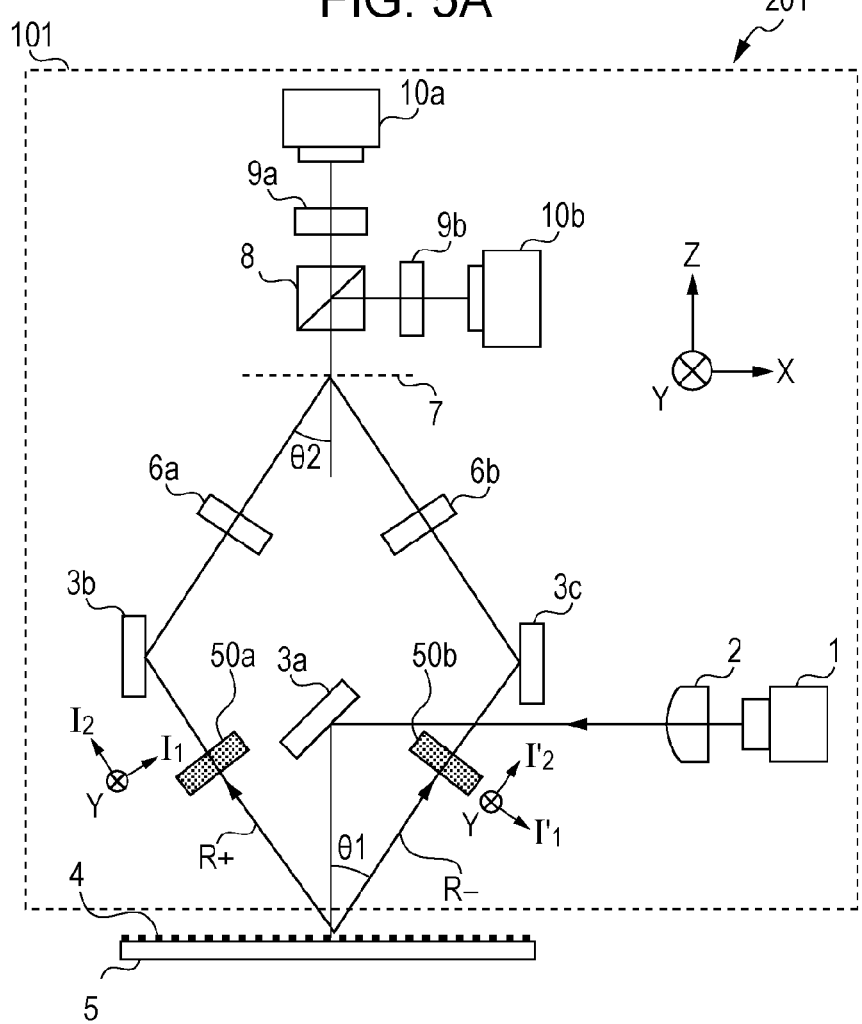
FIGS. 5A and 5B are configuration diagrams of a displacement measurement device according to a second embodiment.

FIG. 5A is a schematic diagram of a displacement measurement device 201 showing a configuration of the second embodiment according to the present invention. The displacement measurement device 201 is made up of a detecting head 101 and scale 5. The point differing from the first embodiment is the placement of the polarizer 50. The displacement measurement device according to the present invention has polarizers 50a and 50b instead of the polarizer 50 in FIGS. 1A and 1B.

According to the present embodiment, two polarizers 50a and 50b are used to transform positive/negative 1st-order diffracted light R+, R− into linearly polarized light in the same polarization direction. At this time, the polarization direction of the linear polarization differs from the first embodiment, and does not need to match the grating direction or cycle direction of the grating pattern 4. As described with the first embodiment, in the case that manufacturing error occurs in the grating pattern, measurement error that changes according to measurement positions occurs from influence from the (1) shift in phase difference at the time of scale diffraction and (2) change in polarization components. In order to reduce the influence from (1) and (2), conditions have to be satisfied wherein each of the light input in the λ/4 plate disposed in each light path of the two diffracted lights reflecting from the scale 5 (I) have the same polarization components and (II) are linearly polarized.

Figure 5B:
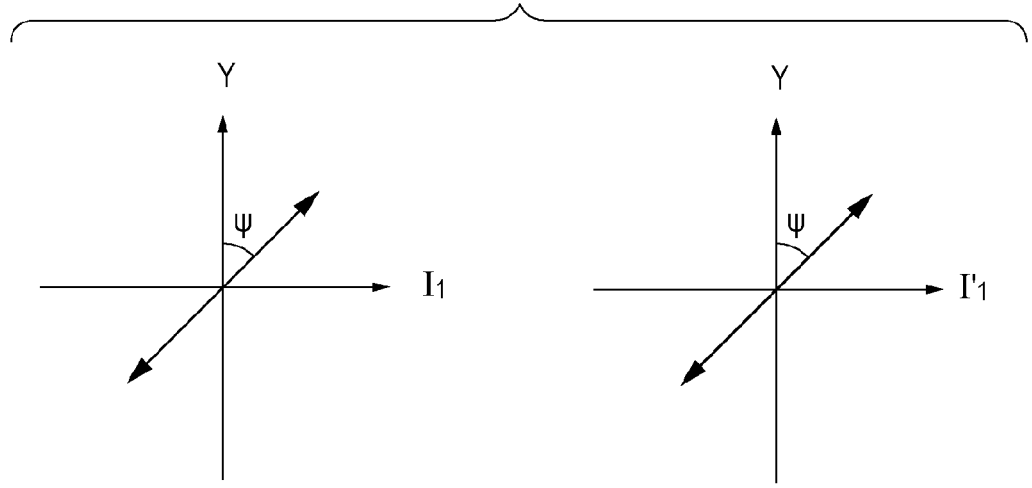

According to the present embodiment, the diffracted light which is diffracted from the scale 5 is transformed into linearly polarized light in a polarization direction wherein the positive/negative 1st-order diffracted light R+, R− which leads to the λ/4 plate 6a and 6b, using the polarizers 50a and 50b, thereby having a configuration that satisfies (I) and (II) described above. FIG. 5B shows the polarization components of the positive/negative 1st-order diffracted light R+, R− on a $I_1Y$ plane and $I_1'Y$ plane of the linear polarization obtained via the polarizer. As shown in FIG. 5B, in order to cause the same polarization direction, the polarizers 50a and 50b are disposed such that the polarization direction of linear polarization makes up an angle ψ wherein the polarization directions of the linear polarization are equal as to the Y-axis. Now, in the case that the polarization directions of the linear polarization via the polarizers 50a and 50b do not match, difference occurs in the phase change amount of the positive/negative 1st-order diffracted light R+, R− at the time of scale diffraction, so (1) shift in phase difference occurs, and measurement error occurs. Also, in the case of not providing the polarizer 50, and not performing transform into linear polarization, the polarization component of the positive/negative 1st-order diffracted light R+, R− becomes elliptical polarization, due to influence from the (2) change in polarization components at the time of scale diffraction, and measurement error occurs. According to the present embodiment, the polarization components of the positive/negative 1st-order diffracted light after passing through the polarizer 50 are the same, and so (1) shifts in phase difference do not occur. Also, the light via the polarizer 50 is linearly polarized, and is transformed into circular polarized light via the λ/4 plates 6a and 6b, so there is no influence from (2) change in polarization components. Accordingly, the polarizers 50a and 50b are disposed and the positive/negative 1st-order diffracted light R+, R− led to the λ/4 plates 6a and 6b are transformed into linearly polarized light in the same polarization directions, thereby reducing influence from the (1) shift in phase difference at the time of scale diffraction and (2) change in polarization components.

Note that for adjustments to rotation shift of the polarizer 50a as to the direction $I_2$ which the light flux of the positive 1st-order diffracted light R+ advances and to rotation shift of the polarizer 50b as to the direction $I_2'$ which the light flux of the negative 1st-order diffracted light R− advances, adjustments should be performed to suppress the measurement error so as to be within a range of acceptable values. According to the present embodiment, in the case that the polarization direction of the linear polarization obtained via the polarizers 50a and 50b differ mutually by 90 degrees, measurement error is maximal, resulting from (1) shift in phase difference. Note that according to the configuration of the displacement measurement device disclosed in Japanese Patent Laid-Open No. 2007-292735, linear polarizers are used to transform the diffracted light into linearly polarized light in a mutually orthogonal direction, and measurement error resulting from the (1) shift in phase difference occurs. Now, if we say that measurement error due to the (1) shift in phase difference is $\Delta X2$, and the angle shift in the polarization direction of the linearly polarized light obtained via the polarizers 50a and 50b respectively is $\Delta \psi$, $\Delta X2$ changes proportionally to sin $\Delta \psi$. That is to say, by adjusting $\Delta \psi$ to 10 degrees or less, the error that occur in the displacement measurement device disclosed in Japanese Patent Laid-Open No. 2007-292735 can be reduced to 1/5 or less. Also, for example, by adjusting $\Delta \psi$ to 5 degrees or less, the error can be reduced to 1/10 or less, which is effective for a displacement measurement device having a measurement precision with high precision. Further, for example, by adjusting $\Delta \psi$ to 0.5 degrees or less, the error can be reduced to 1/100 or less, which is effective for a displacement measurement device having a measurement precision with ultra-high precision. Thus, considering that the measurement error are proportional to sin $\Delta \psi$, by performing adjustments so that the angle shift $\Delta \psi$ of the polarizer 50 becomes small, the measurement error $\Delta X2$ can be reduced.

Also, according to the present embodiment, a configuration may be made wherein the polarizer 50a is disposed between the mirror 3b and the λ/4 plate 6a, and the polarizer 50b is disposed between the mirror 3c and the λ/4 plate 6b.

Thus, by providing the polarizers 50a and 50b, and transforming the positive/negative 1st-order diffracted light R+, R− led to the λ/4 plates 6a and 6b into linearly polarized light in the same polarization directions, measurement error due to manufacturing error in the grating pattern on the scale 5 can be reduced. Therefore, according to the present embodiment, a displacement measurement device which can measure relative displacement amounts of the detecting head 100 and scale 5 with high precision can be provided.

According to the first and second embodiment, description is given for the cases wherein the order of the two diffracted lights is positive/negative 1, but the order of the diffracted light is not necessarily limited to positive/negative 1, and the present invention can be applied even in the case of diffracted light having a different order.

Also, for the laser light source 1 of the detecting head 100, using a He—Ne laser that emits coherent light, solid laser, and semiconductor laser is desirable. Further, a configuration may be used to guide the light from the light source, using optical fiber.

Note that in the event of actually configuring the displacement measurement device 201 in either embodiment, slightly shifting the angle in the grating direction and cycle direction from 90 degrees is desirable, so that the 0-order diffracted light from the scale 5 does not directly return to the laser light source 1. Also, 0-order diffracted light which is unnecessary light and other order diffracted light can be blocked. Further, as a separate configuration of the beam splitter 8 and polarizer 9, the configuration may use a polarization beam splitter (PBS).

Note that a configuration to use the polarizer 50 as a linear polarization generating unit and take out the linearly polarized light from the light emitted from the laser light source 1 is described with either embodiment, but the present invention is not limited to this. For example, a polarizer such as a Glan-Thompson prism or the like may be used.

Third Embodiment

Next, a case of applying the displacement measurement device of the present invention to a stage position measurement device of an exposure apparatus will be described as a third embodiment of the present invention.

Figure 6A:
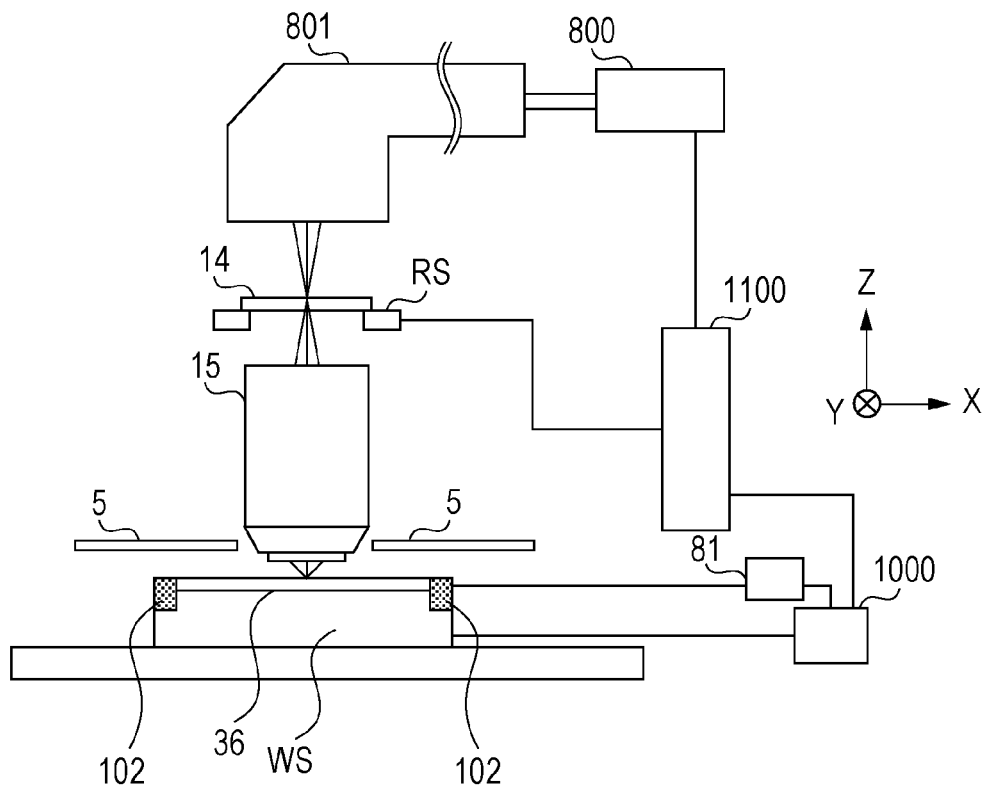
FIGS. 6A and 6B are configuration diagrams of an exposure apparatus according to a third embodiment.
Figure 6B:
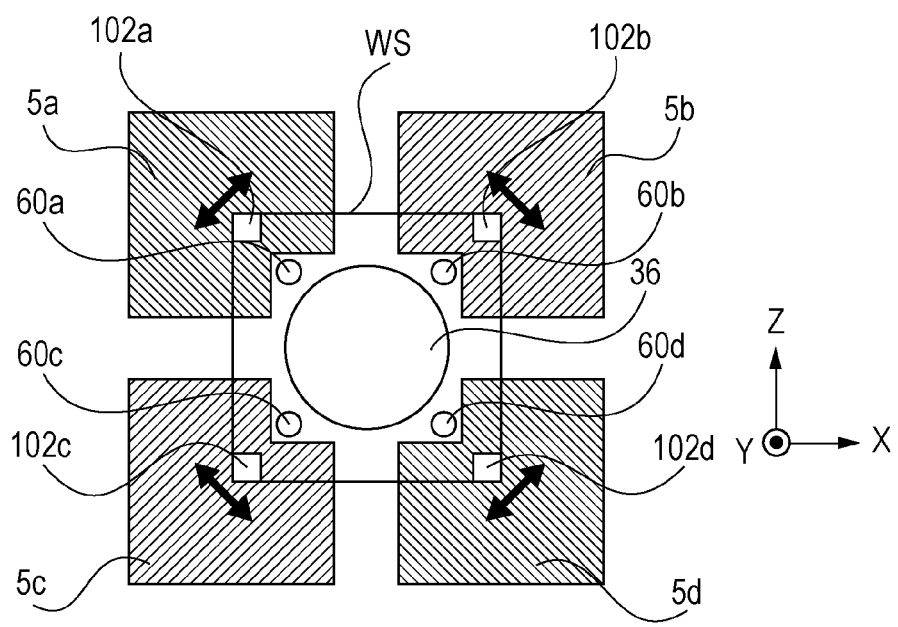

FIGS. 6A and 6B are diagrams showing a configuration of the displacement measurement device of the present invention which has an exposure apparatus. As shown in FIG. 6A, the exposure apparatus has a light source unit 800, reticle stage RS holding a reticle 14, projection optical system 15, scale 5, wafer stage WS holding a wafer 36, and detecting head 102 mounted on the wafer stage WS. The displacement measurement device can apply the displacement measurement device described in the first or second embodiment. Note that the wafer stage WG is made up of a fine-motion stage and a coarse-motion stage, and the detecting head 102 is mounted on the fine-motion stage. The wafer 36 is coated with photoresist.

A stage control unit 1000 is electrically connected to the wafer stage WS, computing processing unit 81, and detecting head 102, and performs position control of the wafer stage WS based on the measurement result of the displacement measurement device. Also, a central control unit 1100 is electrically connected to the stage control unit 1000, light source unit 800, and reticle stage RS, and controls the operation of the exposure apparatus.

Next, the position measurement of the wafer stage WS holding the wafer 36 will be described. The wafer stage WS uses a linear motor and moves the wafer 36 in the X-axis direction, Y-axis direction, Z-axis direction, and the rotational directions of the various axes, similar to the reticle stage RS. According to the present embodiment, the detecting head 102 of the displacement measurement device is mounted on the wafer stage WS. The displacement measurement device measures the relative position relation of the wafer stage WS as to the scale 5 which serves as a measurement reference, at the detecting head 102, thereby performing position measurement of the wafer stage WS.

FIG. 6B shows positional relation of the scale 5 serving as a measurement reference and the wafer stage WS as seen from the Z-axis direction. A one-dimensional grating pattern is formed on the scale 5, and the four scales 5a through 5d are disposed so as to surround the projection optical system 15.

As shown in FIG. 6B, the four scales 5a through 5d are disposed such that the grating directions are in a direction sloping 45 degrees as to the X-axis direction or Y-axis direction, and the displacement in each direction is measured with the four detecting heads 102a through 102d which are mounted on the WS. For example, by using the detecting head 102a to measure the scale 5a, displacement measurement in the direction sloping 45 degrees as to the X-axis can be made. Also, by using the detecting head 102b to measure the scale 5b, displacement measurement in the direction sloping 45 degrees as to the Y-axis can be made. Similarly, by using the detecting head 102c to measure the scale 5c, and using the detecting head 102d to measure the scale 5d, displacement in the direction sloping 45 degrees as to the Y-axis, displacement in the direction sloping 45 degrees as to the X-axis, can be measured. Accordingly, by performing displacement measurement for three appropriate scales, displacement of the rotation Rz axis around the X-axis and Y-axis and Z-axis can be obtained. Also, the wafer stage WS has at least one reference mark 60 (60a through 60d), and performs position matching with the wafer 36 and reticle 14. In the event of position-matching, the position of an alignment mark on the reference mark 60 and wafer 36 is detected with an alignment scope (unshown). The wafer stage WS is controlled and driven based on the detection results herein and the measurement value of the displacement measurement device, and the wafer 36 is moved to the desired position.

Up to this point a case of mounting the displacement measurement device of the present invention on a wafer stage has been described, but this should not be limited to a wafer stage, and may be mounted on a reticle stage RS. In the case of mounting on a reticle stage RS, the displacement of the stage is measured with high precision, and the reticle stage RS can be accurately moved to a desired position.

In accordance with miniaturization of semiconductor devices, for position matching of the reticle and wafer of a semiconductor exposure apparatus, precision in the nanometer order is desired. By using the displacement measurement device as an exposure apparatus according to the present invention, the stage displacement can be measured with high precision, and precision for the position matching of the wafers and reticles have improved. Therefore, there have been advantages such as leading to improvements in semiconductor device functions and yield improvements.

Now, an exposure apparatus using a reticle has been described, but the present invention can be applied to an exposure apparatus that does not use a reticle (e.g. EB exposure apparatus).

Fourth Embodiment

Next, a case wherein the displacement measurement device of the present invention is applied as a stage position measurement device of a laser processing device to perform processing using a laser within a working device, as a fourth embodiment of the present invention.

Figure 7:
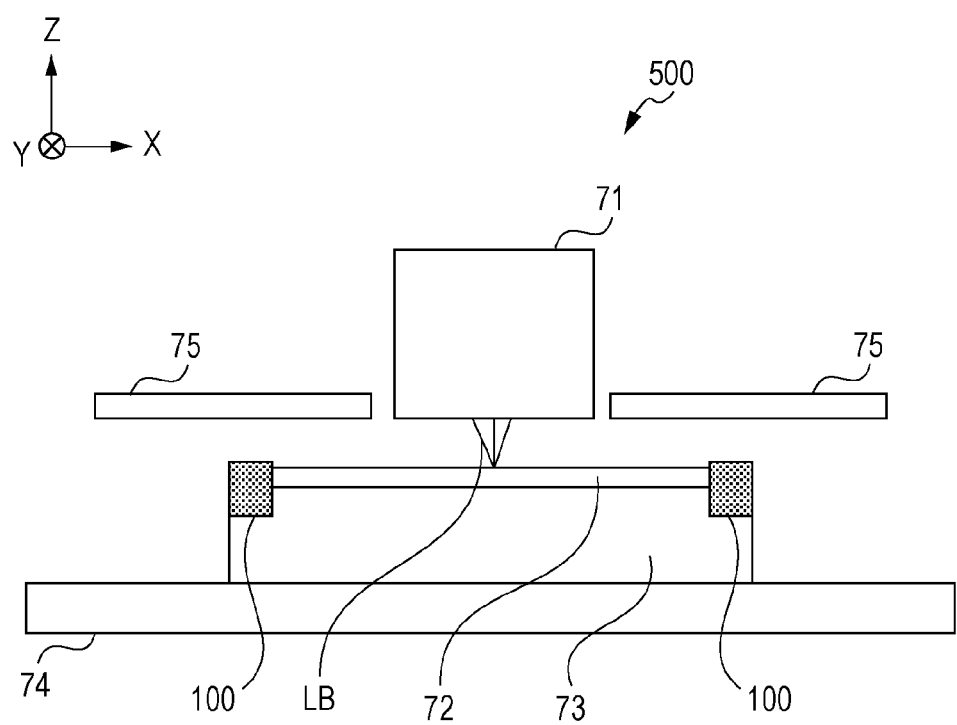
FIG. 7 is a diagram illustrating a configuration of a laser processing device according to a fourth embodiment.

FIG. 7 is a schematic diagram showing a configuration of the displacement measurement device of the present invention provided with a laser processing device 500. As shown in FIG. 7, the laser processing device 500 has a processing head 71, substrate 72, stage 73 that holds the substrate 72, base member 74, scale 75, and detecting head 100 that is mounted on the stage 73. Note that the first and second embodiments can be applied without change to a displacement measurement device that measures displacement amount of the scale 75 using the detecting head 100.

The processing head 71 is made up of an unshown laser oscillator, and an illumination optics system (unshown) that leads the laser beam LB emitted from the laser oscillator to the substrate 72. Now, it is desirable for the laser oscillator to be able to select wavelength, pulse width, and so forth so that the emitted laser beam LB can optimally processing the substrate 72. An excimer laser or YAG laser may be used for the laser oscillator, for example.

The laser beam LB that has been emitted from the processing head 71 collects light in a desired beam form on the substrate 72 that is loaded on the stage 73. The stage 73 is connected to an unshown moving mechanism. The moving mechanism is made up of a linear motor or the like, and can move the substrate 72 by driving the stage 73 in the X-axis direction, Y-axis direction, Z-axis direction, and the rotational directions of each axis. With the laser processing device 500 according to the present embodiment, the stage 73 is driven in the Z-axis direction, and after matching the surface of the substrate 72 to an optimal image face position of the processing head 71, the stage 73 is moved along an X-Y plane, and the relative positions of the substrate 72 and laser beam LB are changed. Thus, the substrate 72 is processed by the laser beam LB, and for example, a desired pattern can be formed on the substrate 72.

A one-dimensional grating pattern is formed on the scale 75, and the scale 75 is disposed so as to surround the processing head 71. According to the present embodiment, the detecting head 100 of the displacement measurement device is mounted on the stage 73. Position measurement of the stage 73 can be performed with the displacement measurement device, by measuring the relative displacement amount of the detecting head 100 as to the scale 75. Therefore, in the event of changing the relative positions of the substrate 72 and laser beam LB, displacement measurement of the detecting head 100 as to the scale 75 can be performed. For example, by driving while controlling the stage 73 based on the measurement values of the displacement measurement device, the position of the laser beam LB can be moved to a desired position on the substrate 72.

Note that up to this point a configuration of the present embodiment wherein the detecting head of the displacement detecting device is disposed on the stage has been described, but the applicability range of the present invention is not limited to this. For example, a configuration may be used wherein the scale is disposed on a stage surface, and the detecting head is fixed in the periphery of the processing head. With this configuration also, similarly, by performing displacement measurement of the scale as to the detecting head, position measurement of the stage can be performed.

Laser processing device has been described here, but the present invention can also be applied to a nano-imprint device that uses a molded head as a processing head.

Thus, in the case that the displacement measurement device of the present invention is used as a stage position measurement device of the laser processing device, the relative displacement amount of the processing head and scale is measured with high precision, and the stage can be moved accurately to a predetermined position. Note that according to the present embodiment, a case has been described wherein the displacement measurement device is used as a stage position measurement device of the laser processing device which is a working device, but the applicability range of the displacement measurement device is not limited to this, and for example, can be widely used for a coordinate measurement device that measures the position coordinates of a reticle or wafer, or precision measurement devices such as a microscope or testing equipment. In these cases also, similarly, the relative displacement of the stage and the measuring head or testing head is measured with high precision, and the stage can be moved accurately to a predetermined position.

Also, a displacement measurement device wherein light is irradiated on a scale on which a grating pattern in formed, and reflected diffracted light is used, has been described for any of the embodiments. However, the present invention may use diffracted light wherein light is irradiated on a scale and transmitted.

Fifth Embodiment

A manufacturing method for a device (semiconductor device, liquid crystal display device, and so forth) will be described as a fifth embodiment of the present invention. A manufacturing method of a semiconductor device will be described as an example.

A semiconductor device is manufactured by following a pre-process wherein an integrated circuit is created on a wafer, and a post-process to complete an integrated circuit chip on the wafer created with the pre-process as a product. The pre-process includes a process to expose the wafer coated with a photoresist, using the above-described exposure apparatus, and a process to develop the wafer. The pos-process includes an assembly process (dicing, bonding) and packaging process (sealing). Note that the liquid crystal display device is manufactured by completing a process to form a transparent electrode. The process to form the transparent electrode includes a process to coat a glass substrate, on which a transparent conductor firm has been vapor-deposited, with a photoresist, a process to expose the glass substrate wherein the photoresist has been coated using the above described exposure apparatus, and a process to develop the glass substrate.

According to the device manufacturing method of the present embodiment, a higher quality device can be manufactured than has been in the past.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-280999 filed Dec. 10, 2009, which is hereby incorporated by reference herein in its entirety.

What is claimed is:

1. A device comprising:
a scale on which a grating pattern is formed;
a light source configured to irradiate light onto the scale;
a plurality of wavelength plates configured to transform each of a plurality of diffracted lights from the scale into circular polarized light, respectively;
an optical system configured to superpose and cause interference of the plurality of diffracted lights;
a photodetector configured to receive the interfered light; and
a generating unit configured to generate linearly polarized light by the light from the light source, so that the plurality of diffracted light input to the plurality of wavelength plates becomes linearly polarized light with a same polarization direction.

2. The device according to claim 1, wherein the generating unit is disposed in the light path between the light source and the scale, and wherein light from the light source is transformed to linearly polarized light when the polarization direction matches the grating direction or cycle direction of the grating pattern.

3. The device according to claim 1, wherein the generating unit is disposed in the light path between the scale and the wavelength plate, and the plurality of diffracted light is transformed into linearly polarized light.

4. The device according to claim 1, wherein the generating unit is a polarizer.

5. An apparatus comprising:
a stage to hold a substrate; and
a measurement device to measure displacement of the stage; wherein
the measurement device comprises:
a scale on which a grating pattern is formed;
a light source configured to irradiate light on the scale;
a plurality of wavelength plates configured to transform each of a plurality of diffracted light from the scale into circular polarized light, respectively;
an optical system configured to superpose and cause interference of the plurality of diffracted light;
a photodetector configured to receive the interfered light; and
a generating unit configured to generate linearly polarized light by the light from the light source, so that the plurality of diffracted light input to the plurality of wavelength plates becomes linearly polarized light with a same polarization direction.

6. The apparatus according to claim 5, wherein the generating unit is disposed in the light path between the light source and the scale, and wherein light from the light source is transformed to linearly polarized light when the polarization direction matches the grating direction or cycle direction of the grating pattern.

7. The apparatus according to claim 5, wherein the generating unit is disposed in the light path between the scale and the wavelength plate, and the plurality of diffracted light is transformed into linearly polarized light.

8. The apparatus according to claim 5, wherein the generating unit is a polarizer.

9. A method comprising:
exposing a substrate using the apparatus according to claim 5; and
developing the exposed substrate.

10. The method according to claim 9, wherein the generating unit is disposed in the light path between the light source and the scale, and wherein light from the light source is transformed to linearly polarized light when the polarization direction matches the grating direction or cycle direction of the grating pattern.

11. The method according to claim 9, wherein the generating unit is disposed in the light path between the scale and the wavelength plate, and the plurality of diffracted light is transformed into linearly polarized light.

12. The method according to claim 9, wherein the generating unit is a polarizer.

13. The apparatus according to claim 5 further comprising:
a processing head configured to process the substrate.

14. A device comprising:
a scale on which a grating pattern is formed;
a light source configured to irradiate light on the scale;
a plurality of wavelength plates configured to transform each of a plurality of diffracted light from the scale into circular polarized light, respectively;
an optical system configured to superpose and cause interference of the plurality of diffracted light; and
a photodetector configured to receive the interfered light;
wherein the light source emits linearly polarized light, and irradiates the scale so that a polarization direction of the linearly polarized light matches a grating direction or cycle direction as to the grating pattern.

15. An apparatus comprising:
a stage to hold a substrate; and
a measurement device to measure displacement of the stage; wherein the measurement device comprises:
a scale on which a grating pattern is formed;
a light source configured to irradiate light on the scale;

an each of wavelength plates configured to transform each of a plurality of diffracted light from the scale into circular polarized light, respectively;

an optical system configured to superpose and cause interference of the plurality of diffracted light; and a photodetector to receive the interfered light;

wherein the light source emits linearly polarized light, and irradiates the scale so that a polarization direction of the linearly polarized light matches a grating direction or cycle direction as to the grating pattern.

16. A method comprising:

exposing a substrate using the apparatus according to claim 15; and developing the exposed substrate.

17. The apparatus according to claim 15 further comprising:

a processing head to process the substrate.

* * * * *